United States Patent
Akiyama et al.

(10) Patent No.: US 8,681,498 B2
(45) Date of Patent: Mar. 25, 2014

(54) MEMBER THAT CONTAINS ELECTRONIC COMPONENTS, AND POWER CONVERSION DEVICE

(75) Inventors: Tadashi Akiyama, Okazaki (JP); Ray Mizutani, Toyota (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 13/582,682

(22) PCT Filed: Mar. 22, 2011

(86) PCT No.: PCT/JP2011/056800
§ 371 (c)(1),
(2), (4) Date: Sep. 4, 2012

(87) PCT Pub. No.: WO2011/132491
PCT Pub. Date: Oct. 27, 2011

(65) Prior Publication Data
US 2012/0320528 A1   Dec. 20, 2012

(30) Foreign Application Priority Data
Apr. 19, 2010  (JP) .................................. 2010-096133

(51) Int. Cl.
*H05K 7/20* (2006.01)
(52) U.S. Cl.
USPC .................. 361/702; 361/679.01; 361/679.02; 361/679.53; 361/679.54; 361/690; 361/699; 361/704; 361/714; 165/80.3; 165/104.33; 165/185; 174/50.52; 174/520; 312/223.1; 310/54; 310/58; 123/41.31

(58) Field of Classification Search
USPC ............ 361/679.01, 679.02, 679.46–679.54, 361/690–697, 688, 689, 700–715; 165/80.2, 80.3, 80.4, 80.5, 104.33, 165/104.34, 185; 174/50, 50.52, 520; 123/41.31, 647, 195 E, 198 E, 5, 184.24, 123/478; 310/52, 54, 58, 64, 75 R; 312/223.1, 223.2, 236
See application file for complete search history.

(56) References Cited

U.S. PATENT DOCUMENTS 5,207,186 A * 5/1993 Okita ......................... 123/41.31
5,585,205 A   12/1996 Kohchi
(Continued)

FOREIGN PATENT DOCUMENTS

| DE | 197 16 401 C2 | 11/2001 | |
|---|---|---|---|
| DE | 10 2008 027 584 B3 | 12/2009 | |
| JP | 2003-045392 A | 2/2003 | |
| JP | 2004-175301 A | 6/2004 | |
| JP | 2004168259 A * | 6/2004 | ............ B60K 13/02 |
| JP | 2004-181979 A | 7/2004 | |
| JP | 2005-212498 A | 8/2005 | |
| JP | 2005-219531 A | 8/2005 | |
| JP | 2006-245421 A | 9/2006 | |
| JP | 2007-200915 A | 8/2007 | |
| JP | 2010-000938 A | 1/2010 | |

OTHER PUBLICATIONS

International Search Report of PCT/JP2011/056800, dated May 17, 2011.

*Primary Examiner* — Michaeil V Datskovskiy
(74) *Attorney, Agent, or Firm* — Sughrue Mion, PLLC

(57) ABSTRACT

Disclosed is a member that contains electronic components. Using the member, when, for example, a vehicle or the like carrying electronic components such as an inverter collides with an external object, there is prevented damage to a housing containing the electronic components, which would otherwise occur due to interfering objects. Furthermore, the disclosed member can dissipate heat produced by the contained electronic components. The member includes a housing for containing electronic components, a cooling passage that is provided inside the housing and uses a refrigerant to cool the electronic components, and a heat dissipation part that dissipates heat from the cooling passage and prevents the housing from being damaged by impacts from external interfering objects.

9 Claims, 4 Drawing Sheets

(56) References Cited

U.S. PATENT DOCUMENTS

| | | | |
|---|---|---|---|
| 5,856,909 A | 1/1999 | Kamo et al. | |
| 6,396,692 B1 * | 5/2002 | Farshi et al. | 361/690 |
| 6,487,995 B2 * | 12/2002 | Markyvech et al. | 123/41.31 |
| 6,796,802 B2 * | 9/2004 | Iwata | 439/34 |
| 7,113,400 B2 * | 9/2006 | Nagata et al. | 361/690 |
| 7,434,872 B2 * | 10/2008 | Steller | 296/193.09 |
| 8,414,013 B2 * | 4/2013 | Koyama | 280/727 |
| 2002/0057813 A1 * | 5/2002 | Burleson et al. | 381/189 |
| 2003/0070858 A1 * | 4/2003 | Kondo | 180/291 |
| 2004/0160731 A1 * | 8/2004 | Yamaguchi | 361/600 |
| 2010/0127583 A1 * | 5/2010 | Yoshida et al. | 310/59 |
| 2010/0283337 A1 * | 11/2010 | Omiya et al. | 310/64 |
| 2010/0301692 A1 * | 12/2010 | Shirakata et al. | 310/89 |
| 2011/0026229 A1 * | 2/2011 | Hsiao et al. | 361/752 |

* cited by examiner

MEMBER THAT CONTAINS ELECTRONIC COMPONENTS, AND POWER CONVERSION DEVICE

CROSS REFERENCE TO RELATED APPLICATIONS

This application is a National Stage of International Application No. PCT/JP2011/056800 filed Mar. 22, 2011, claiming priority based on Japanese Patent Application No. 2010-096133 filed Apr. 19, 2010, the contents of all of which are incorporated herein by reference in their entirety.

TECHNICAL FIELD

The present invention relates to an electric component container member for containing an electronic component such as a power converter including an inverter or the like, and to a power conversion device including the container member.

BACKGROUND ART

Recently, electric motor cars that are powered by an electric motor, such as hybrid vehicles (HV), electric vehicles (EV), or the like, have drawn great attention as environmentally friendly vehicles. Hybrid vehicles use a direct current source, an inverter, and a motor driven by the inverter serving as a power source, in addition to a conventional engine. More specifically, the engine is driven to obtain a power source and, at the same time, direct current voltage supplied from the direct current source is converted to alternating current voltage by the inverter and the alternating current voltage which is converted is used to rotate the motor to thereby obtain a power source. Further, electric vehicles use a direct current source, an inverter, and a motor driven by the inverter serving as a power source. More specifically, these electric vehicles include an electric system for supplying electric power from a direct current power source formed of a secondary battery or the like to an alternating current motor for driving a car, via a semiconductor power converter such as an inverter.

Electronic components including a power conversion device such as an inverter are contained in a housing or the like and disposed at the front portion, the rear portion, or the like, of a vehicle. Because the power converter such as an inverter used for driving a motor or the like generates a large amount of heat, the power conversion device is generally cooled by a cooling device or the like which supplies a refrigerant such as coolant into a circulating route, which passes through the power converter, for circulation, by using a motor-driven water pump or the like.

When such an electric motor car collides with an external object, there is a possibility that the housing that contains an electronic component such as an inverter interferes with a peripheral component (an interfering object) such as trans-axle and is damaged. Further, if the housing is damaged, there is a possibility that a high-voltage portion of the electronic component such as an inverter is exposed. For example, as illustrated in FIG. 7, when a vehicle in which a housing 50 containing an electronic component such as an inverter having a high-voltage portion 52 is mounted collides with an external object on its side, there is a possibility that the housing 50 interferes with an interfering object 54 which is a peripheral component such as a trans-axle and is broken. Also, if the housing 50 is broken, there is a possibility that the high-voltage potion 52 of the electronic component such as an inverter is exposed.

Patent Literature 1, for example, describes a cooling housing for containing an electronic component such as an inverter circuit and including a wall portion which is partially cooled so as to prevent the wall portion of the housing, when it is broken, from contacting the electronic component such as an inverter circuit and causing short-circuit. The cooling housing includes therewithin a bag for containing the electronic component, formed of an insulating elastic member which is easily deformed with respect to an external force.

Patent Literature 2 describes, as a power control unit for an electric vehicle, in which short-circuit of a high-voltage terminal mount does not occur even when a motor chamber is deformed due to collision in the front-back direction, and a cost reduction, a size reduction design, increased assembling properties can be achieved with increased reliability, a power control unit for an electric vehicle, which is equipped with a voltage control unit that performs voltage adjustment between an inverter for driving a traveling motor and a power source within a high-voltage box. An outer wall surface of the high-voltage box is protected with a high-strength member, and the high-voltage terminal mount for connecting the inverter and the traveling motor is disposed adjacent to an inner wall surface of the high-voltage box which is protected with the high-strength member.

Patent Literature 3 describes an electric vehicle including a cell portion for generating electric power, an electric power control circuit electrically connected with the cell portion, and an electric power control unit including a disposing portion of the electric power control circuit. In the electric vehicle, in order to protect a cell which is mounted when collision of the electric vehicle occurs, the cell portion and the electric power control unit are fixed to a vehicle body in a manner such that they are arranged in the vertical direction, and the disposing portion includes a projection portion which projects from an edge of the cell portion in the horizontal direction toward the predetermined direction in which collision is expected.

Patent Literature 4 describes a fixing structure for on-vehicle devices, which includes the following, in order to prevent the on-vehicle devices mounted on a vehicle from colliding with other members at the time of collision of the vehicle. Specifically, the fixing structure includes on-vehicle devices, a disposing mount which is fixed to a vehicle body defining a storage chamber capable of storing the on-vehicle devices and on which the on-vehicle devices are mounted, a fixing mechanism which fixes the on-vehicle devices and, when a pressing force of a predetermined magnitude or more is applied to the on-vehicle devices, can release the fixed state of the on-vehicle devices, a guide member connected with the disposing mount, which extends toward the backward side of the vehicle body with respect to the on-vehicle devices such that the guide member is inclined upwards toward the backward side of the vehicle body with respect to the on-vehicle devices, and a support member which is connected with the vehicle body and supports a portion of the guide member which is located on the rear side with respect to the on-vehicle devices.

According to the technology disclosed in Patent Literatures 1 to 4, however, there is a possibility that damage to the housing which stores electronic components caused by a peripheral component (an interfering component) cannot be sufficiently absorbed or reduced at the time of collision or the like.

PRIOR ART DOCUMENTS

Patent Literature

Patent Literature 1: JP 2006-245421 A
Patent Literature 2: JP 2004-181979 A
Patent Literature 3: JP 2004-175301 A
Patent Literature 4: JP 2010-000938 A

SUMMARY OF THE INVENTION

Technical Problems

The present invention provides a member that contains electric components, which prevents damage to a housing containing electronic components caused by an interfering object and has an effect of dissipating heat from the electronic components when a vehicle or the like in which the electronic components such as an inverter are mounted collides with an external object, and a power conversion device including the container member.

Solution to Problems

In accordance with an aspect of the invention, there is provided a member that contains an electronic component, the member comprising a housing that contains an electronic component; a cooling passage that is provided within the housing for cooling heat generated from the electronic component by a refrigerant; and a heat dissipation section that dissipates heat from the cooling passage and prevents damage to the housing caused by impact from an external interfering object.

Further, it is preferable that in the member that contains an electronic component, at least a portion of the cooling passage is provided so as to be opposed to the external interfering object with the heat dissipation section being interposed between the cooling passage and the external interfering object.

Also, it is preferable that in the member that contains an electronic component, a high-voltage portion of the electronic component is provided so as to be opposed to the external interfering object with the heat dissipation section and at least a portion of the cooling passage being interposed therebetween.

In addition, it is preferable that in the member that contains an electronic component, the heat dissipation section is formed of a plate member provided on an external surface of the housing.

Furthermore, it is preferable that in the member that contains an electronic component, with the plate member, a gap portion is formed between the external surface of the housing and the plate member.

Moreover, it is preferable that in the member that contains an electronic component, the plate member has a slope shape.

Also, it is preferable that in the member that contains an electronic component, the heat dissipation section is formed of an inclined rib member provided on an external surface of the housing.

Further, it is preferable that in the member that contains an electronic component, the electronic component is a power converter that performs power conversion from direct-current power or alternating-current power from a power source to alternating-current power or direct-current power.

In accordance with another aspect, there is provided a power conversion device, comprising the member that contains an electronic component; and a power converter that is contained in the member that contains an electronic component for performing power conversion from direct-current power or alternating-current power from a power source to alternating-current power or direct-current power.

Advantageous Effects of Invention

According to the present invention, it is possible to provide a member that contains an electronic component, which, with a cooling passage provided within a housing and a heat dissipation section that dissipates heat from the cooling passage and prevents damage to the housing caused by impact from an external interfering object, prevents damage to the housing containing the electronic component caused by an interfering object when a vehicle in which the electronic component such as an inverter is mounted collides with the external object, and also has an effect of dissipating heat generated from the electronic component, and a power conversion device including the container member.

EMBODIMENTS OF THE INVENTION

Preferred embodiments of the present invention will be described. The embodiments are only examples for implementing the present invention, and the present invention is not limited to the embodiments.

Figure 1:
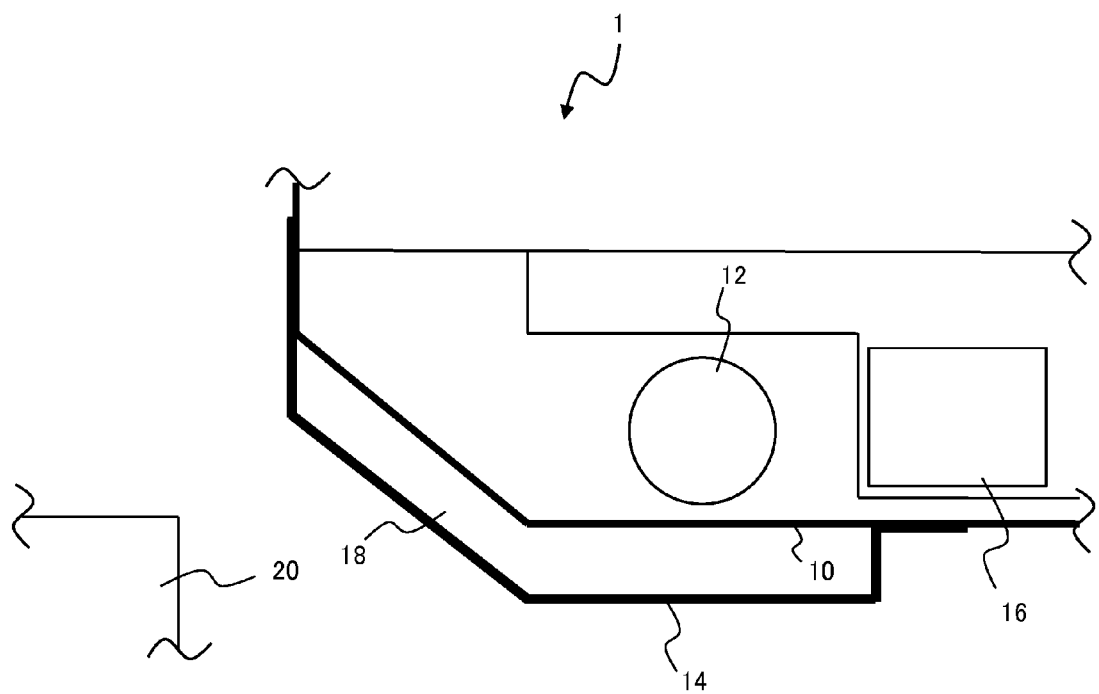
FIG. 1
View schematically illustrating (a part of) a structure of an example member that contains an electronic component according to an embodiment of the present invention.

FIG. 1 schematically illustrates (a part of) the structure of an example member that contains electronic components according to an embodiment. A container member 1 includes a housing 10 for containing electronic components. A cooling passage 12 for cooling heat generated from an electronic component (e.g. a high-voltage portion 16 of an electronic component) by using a refrigerant is provided within the housing 10. Further, a plate member 14 is provided on the external surface of the housing 10 as a heat dissipation section for dissipating heat from the cooling passage 12 and also preventing damage to the housing 10 caused by impact from an external interfering member 20.

The electronic component (e.g. an inverter) within the housing 10 can perform a predetermined function (e.g. power conversion). The generated heat resulting from the operation of the electronic component can be cooled by allowing a refrigerant to pass (e.g. circulate) through a cooling passage 12 which passes at least the vicinity of a heat generation portion of the electronic component, and further the heat from the cooling passage 12 can be dissipated from a heat dissipation section (the plate member 14 in this example) to the outside. The electronic component can be controlled by an external control device or the like. When the electronic component is an inverter that is electrically connected with a cell section, a dynamo-electric machine, or the like, because a large amount of electric current flows in the inverter, a large amount of heat may be generated in association with electric resistance. The cooling passage 12 can function to dissipate such heat and serves to cause the refrigerant such as water flowing through the cooling passage 12 to draw the heat.

Figure 2:
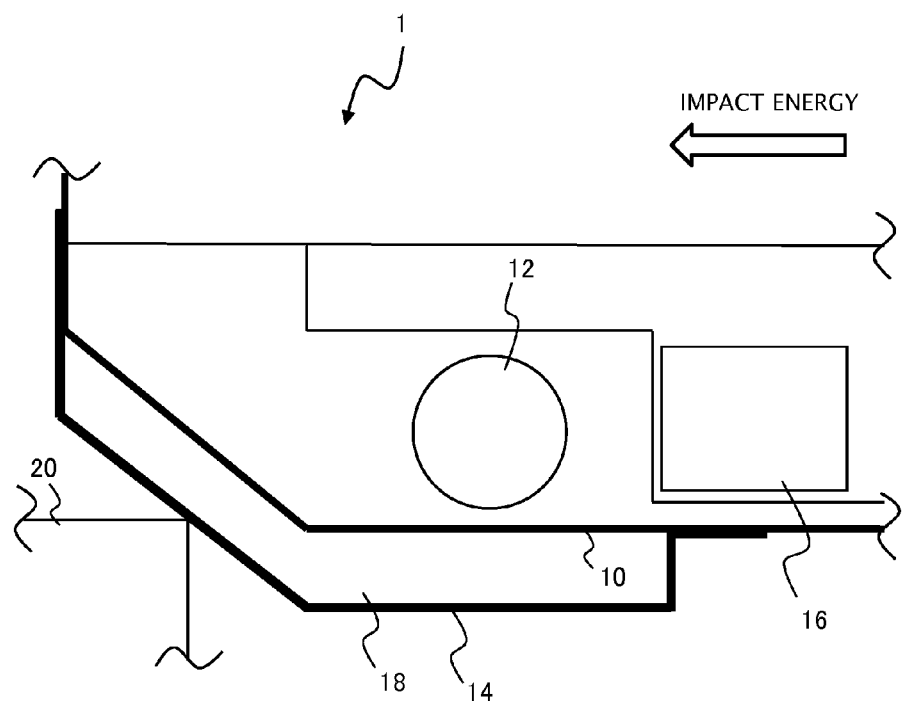
FIG. 2
View schematically illustrating a state in which the container member illustrated in FIG. 1 interferes with an external interfering object.

With the structure of the container member 1 described above, because the plate member 14 serving as the heat dissipation section is opposite the external interfering object 20, for example, when the container member 1 receives impact energy from the direction which is opposite the interfering object 20 via the container member 1; for example, as illustrated in FIG. 2, damage to the housing 10 can be prevented by the plate member 14 even when the container member 1 interferes with the interfering object 20. Further, by disposing the cooling passage 12 near the heat dissipation section (the plate member 14 in this example), the effect of dissipating heat from the cooling passage 12 at the time of operation of the electronic component can be obtained. Heat can be dissipated from the surface of the plate member 14 after heat is conducted from the cooling passage 12 through the housing 10 and the plate member 14, for example.

In the present embodiment, it is preferable that, with the plate member 14, a gap portion 18 is formed between the external surface of the housing 10 and the plate member 14. It is further preferable that at least a portion of the cooling passage 12 is provided so as to be opposed to the external interfering object 20 with the plate member 14 serving as the heat dissipation section and the gap portion 18 being interposed therebetween.

With the structure of the container member 1 described above, if the plate member 14 which is a heat dissipation section and the gap portion 18 are opposed to the external interfering object 20 and the container member 1 receives impact energy from the direction opposite the interfering object 20 with the container member 1 being interposed therebetween, even when the container member 1 interferes with the interfering object 20, damage to the housing 10 can be prevented by means of the plate member 14. Further, even if the plate member 14 is deformed, damage to the housing 10 can be prevented by the presence of the gap portion 18. In addition, by disposing the cooling passage 12 near the heat dissipation section having the gap portion 18, the effect of dissipating heat from the cooling passage 12 during the operation of the electronic component can be achieved more reliably. The heat dissipation can be performed through the surface of the plate member 14 by heat conduction from the cooling passage 12 sequentially to the housing 10 and the plate member 14, for example, and an air cooling effect can be achieved. Further, as the traveling wind flows through the gap portion 18 during traveling of the vehicle, the air cooling effect can be further achieved.

Further, in the present embodiment, it is preferable that the high-voltage portion 16 of the electronic component such as an inverter is provided so as to be opposed to the external interfering object 20 with the plate member 14 which is the heat dissipation section and the gap portion 18 and at least a portion of the cooling passage 12 being interposed therebetween.

With the structure of the container member 1 described above, if the plate member 14 which is the heat dissipation section and the gap portion 18 are opposed to the external interfering object 20 and the container member 1 receives impact energy from the direction opposite the interfering object 20, with the container member 1 being interposed therebetween, even when the container member 1 interferes with the interfering object 20, damage to the housing 10 can be prevented by means of the plate member 14, and the high-voltage portion 16 of the electronic component can be prevented from being exposed to the outside. Further, even if the plate member 14 is deformed, damage to the housing 10 can be prevented by the presence of the gap portion 18, and also exposure of the high-voltage portion 16 of the electronic component to the outside can be prevented. In addition, should the housing 10 be damaged, the cooling passage 12 serves as a crash box that absorbs the energy at the time of interference, so that exposure of the high-voltage portion 16 of the electronic component to the outside can be prevented.

The material of the plate member 14 is not particularly limited, and may be, for example, a metal such as iron, steel, aluminum, or the like, a resin, and so on. However, a metal can be generally used, in view of the strength, thermal conductivity, and so on.

The plate member 14 may be machined in a predetermined shape and attached to the housing 10, or may be integrally formed with the housing 10. While no particular limitation is imposed on the machining shape of the plate member 14 so long as it prevents damage to the housing 10 caused by an impact from the external interfering object 20, it is preferable that the plate member 14 has at least a shape which is inclined with respect to the external interfering object 20. With this structure, if the plate member 14 which is the radiation section is opposed to the external interfering object 20 and the container member 1 receives impact energy from the direction opposite to the interfering object 20 with the container member 1 being interposed therebetween, for example, even when the container member 1 interferes with the interfering object 20, the housing 10 may be pushed up due to the slide effect by the slope of the plate member 14 so that the impact energy can be released to prevent damage to the housing 10.

Further, as described above, the gap portion 18 may be formed between the external surface of the housing 10 and the plate member 14 by the plate member 14, or the plate member 14 may be closely adhered to the external surface of the housing 10.

The electronic component contained in the member that contains the electronic component according to the present embodiment is not particularly limited, and may be an electronic component having a high-voltage portion, for example. The electronic component may be, for example, a power conversion device such as an inverter that converts direct current power from a direct current power source to alternating current power, a converter that converts alternating current power from an alternating current power source to direct current power, and so on. The inverter may convert direct current voltage from the direct current power source to alternating current power to drive a motor generator or the like.

Further, the inverter may convert the alternating current voltage generated by the motor generator or the like to direct current voltage to charge the direct current power source. In other words, an inverter may be a "power converter" that performs power conversion between the direct current power supplied by a direct current power source and the alternating current power that controls driving of a motor and the alternating current power generated by a generator or the like.

As a relatively large amount of electric current may flow through the electronic component such as an inverter, a cooling mechanism for preventing the temperature rise can be provided. The member that contains an electronic component according to the present embodiment can be configured to cool the electronic component by causing a refrigerant for cooling the electronic component such as an inverter to flow through the cooling passage 12.

The cooling passage 12 may be a circulating route passing near or within the electronic component such as an inverter, and preferably passing near or within the heat generation portion of the electronic component, and a refrigerant such as cooling water including antifreeze can be supplied to the cooling passage 12 by means of an external motor-driven pump or the like. The cooling passage can be provided at least near the internal surface of the housing 10. This may facilitate heat conduction from the cooling passage 12 to the outside of the housing 10. A heat exchanger such as a radiator may be provided to the cooling passage 12 external to the housing 10.

As the refrigerant, a liquid such as water or oil can be normally used, but gas such as air may also be used.

The housing 10 may be a box having a predetermined shape which is not particularly limited.

The material of the housing 10 is not particularly limited, and may be, for example, a metal such as iron, steel, aluminum, or the like, a resin, and so on. However, a metal can be generally used, in view of the strength, and so on.

No particular limitation is imposed on the external interfering object 20, so long as it is a peripheral component disposed in the periphery of the container member 1, and may be a peripheral component such as a trans-axle, for example.

Figure 3:
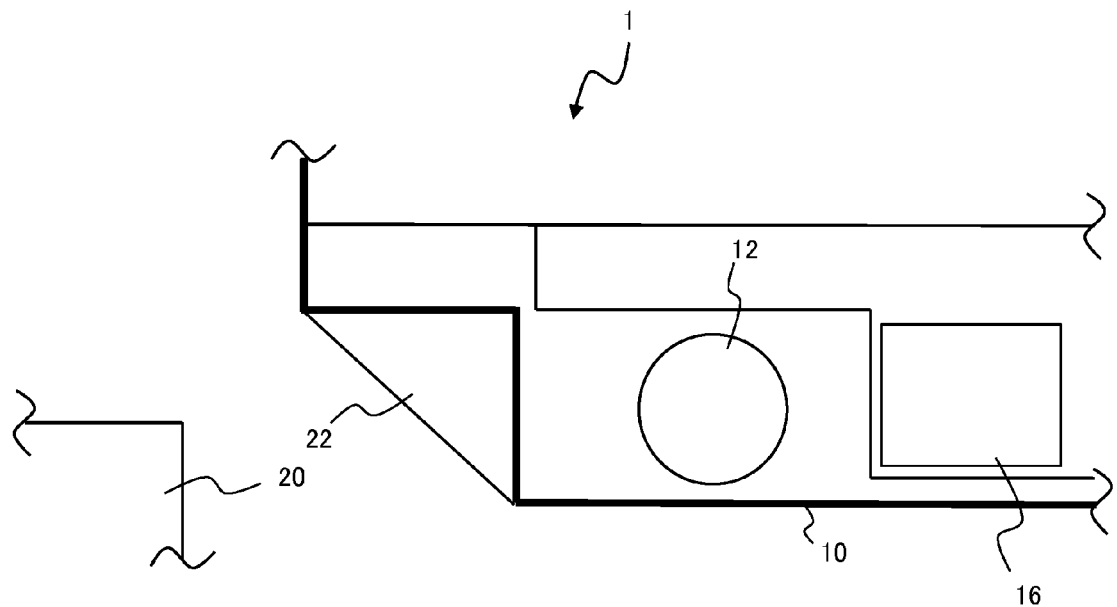
FIG. 3
View schematically illustrating (a part of) a structure of another example member that contains an electronic component according to another embodiment of the present invention.

FIG. 3 schematically illustrates (a part of) the structure of another example member that contains an electronic component according to the present embodiment. A container member 1 includes a housing 10 for containing an electronic component. A cooling passage 12 for cooling heat generated from the electronic component (e.g. a high-voltage section 16 of an electronic component) by using a refrigerant is provided within the housing 10. Further, a rib member 22 is provided on the outer surface of the housing 10 as a heat dissipation section for dissipating heat from the cooling passage 12 and preventing damage to the housing 10 which would otherwise be caused by impact from an external interfering member 20.

Figure 4:
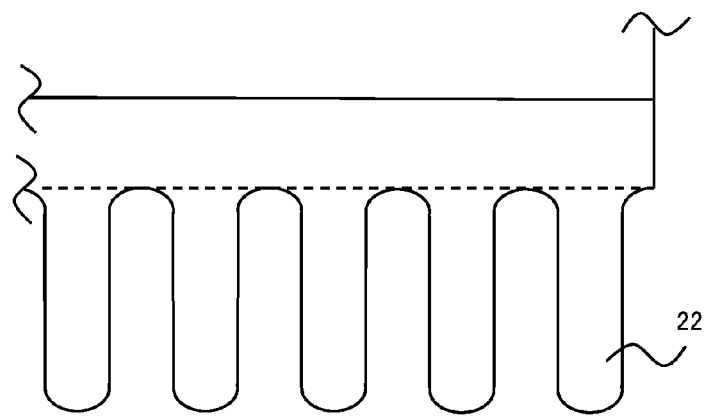
FIG. 4
Front view schematically illustrating an example rib structure in the container member according to the embodiment of the present invention.
Figure 5:
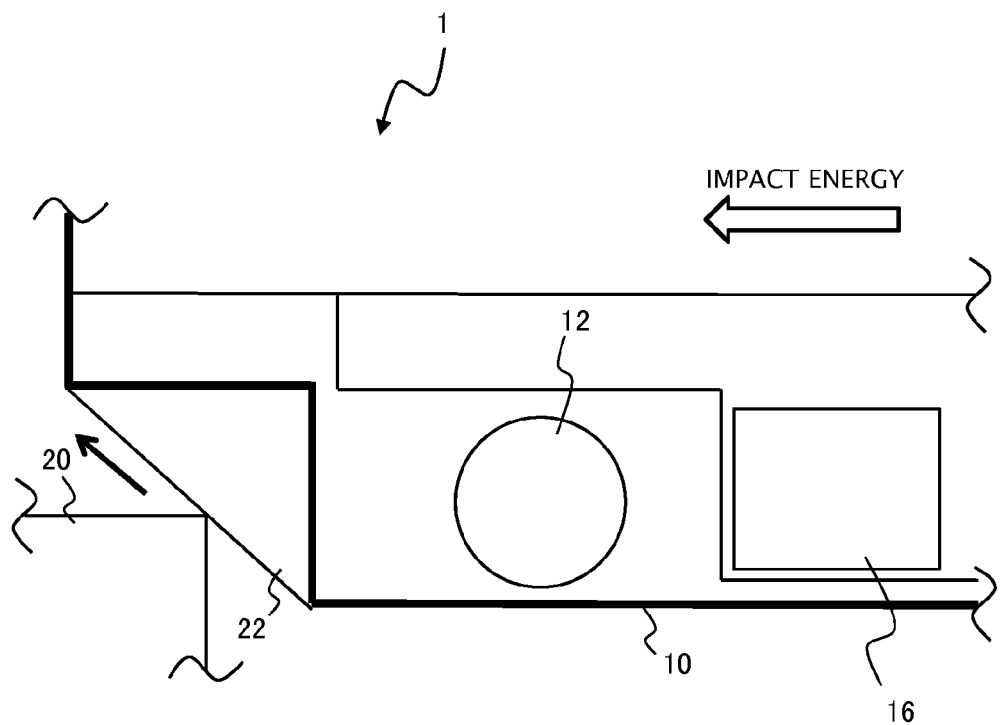
FIG. 5
View schematically illustrating a state in which the container member illustrated in FIG. 3 interferes with an external interfering object.

FIG. 4 schematically illustrates a front view of an example rib structure. The material of the rib member 22 is not particularly limited, and may be a metal such as iron, steel, aluminum, or the like, a resin, and so on. A metal can be generally used, in view of the strength, heat conductivity, and so on.

The rib member 22 which is machined in a predetermined shape may be attached to the housing 10, or may be integrally formed with the housing 10. The machining shape of the rib member 22 may have a shape which is at least inclined with respect to the external interfering object 20 as illustrated in the side view of the rib member 22 in FIG. 3, so as to prevent damage to the housing 10 caused by an impact from the external interfering object 20.

With the structure of the container member 1 as described above, if the rib member 22 which is the radiation section is opposed to the external interfering object 20 and the container member 1 receives impact energy from the direction opposite the interfering object 20 with the container member 1 being interposed therebetween, for example, even when the container member 1 interferes with the interfering object 20, the housing 10 may be pushed up due to the slide effect by the slope of the rib member 22 so that the impact energy is released to prevent damage to the housing 10. Further, as the heat dissipation section has a rib structure, the surface area which contributes to heat dissipation is increased, so that the effect of dissipating heat from the cooling passage 12 at the time of operation of the electronic component can be achieved. The heat dissipation can be achieved through the surface of the cooling passage 12 by means of head conduction from the cooling passage 12 through the housing 10 and the rib member 22, for example.

In the present embodiment, it is preferable that at least a portion of the cooling passage 12 is disposed so as to be opposed to the external interfering object 20 with the rib member 22, which is the heat dissipation section, being interposed in between.

With the structure of the container member 1 described above, if the rib member 22 which is the heat dissipation section is opposed to the external interfering object 20 and the container member 1 receives impact energy from the direction opposite to the interfering object 20 with the container member 1 being interposed therebetween, even when the container member 1 interferes with the interfering object 20, damage to the housing 10 can be prevented by means of the rib member 22. Further, by disposing the cooling passage 12 near the heat dissipation section (the rib member 22 in this example), the effect of dissipating heat from the cooling passage 12 at the time of operation of the electronic component can be obtained.

Further, according to the present embodiment, as illustrated in FIG. 3, it is preferable that the high-voltage portion 16 of the electronic component such as an inverter is provided so as to be opposed to the external interfering object 20, with the rib member 22 which is the heat dissipation section and at least a portion of the cooling passage 12 being interposed therebetween.

With the structure of the container member 1 described above, if the rib member 22 which is the heat dissipation section is opposed to the external interfering object 20 and the container member 1 receives impact energy from the direction opposite the interfering object 20 with the container member 1 being interposed therebetween, even when the container member 1 interferes with the interfering object 20, damage to the housing 10 can be prevented by means of the rib member 22, and the high-voltage portion 16 of the electronic component is prevented from being exposed to the outside. Further, even if the rib member 22 is damaged, the cooling passage 12 serves as a crash box that absorbs the energy at the time of the interference, so that exposure of the high-voltage portion 16 of the electronic component to the outside can be prevented.

In the present embodiment, if sufficient strength cannot be provided only by the rib structure, by adopting a structure including the plate member as illustrated in FIG. 1 and the rib member as illustrated in FIG. 3 in combination, damage to the housing can be prevented more reliably in the case where a vehicle or the like in which electronic components are mounted collides with an external object, and also an effect of dissipating heat from the plate member surface can be expected.

The power conversion device according to the present embodiment includes the container member for an electronic component described above, and a power converter that is contained in the container member and that performs power conversion from direct-current power or alternating-current power from a power source to alternating-current power or direct-current power.

Figure 6:
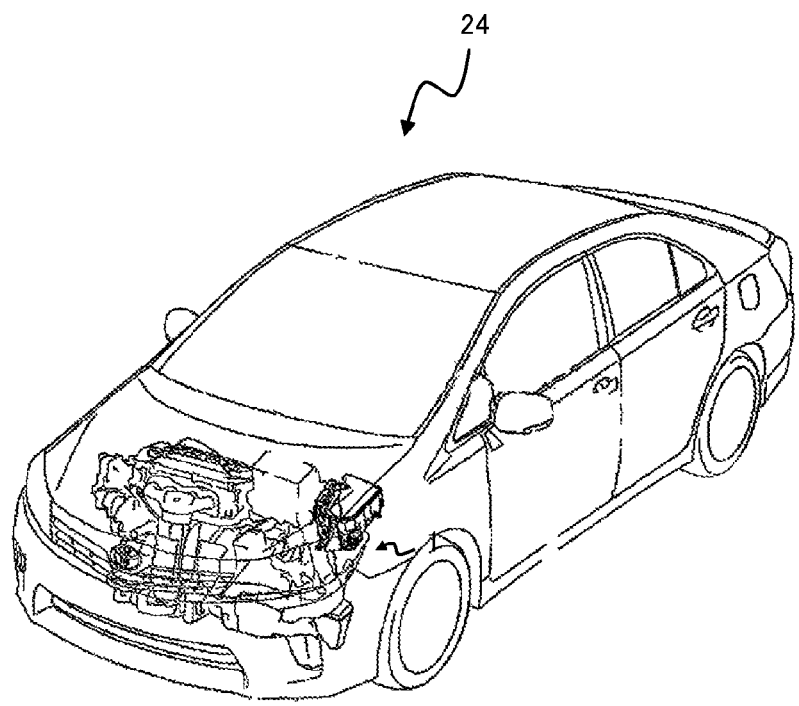
FIG. 6
View illustrating an example in which the container member according to the present embodiment is mounted in a vehicle when the electronic component contained in the container member is an inverter.
Figure 7:
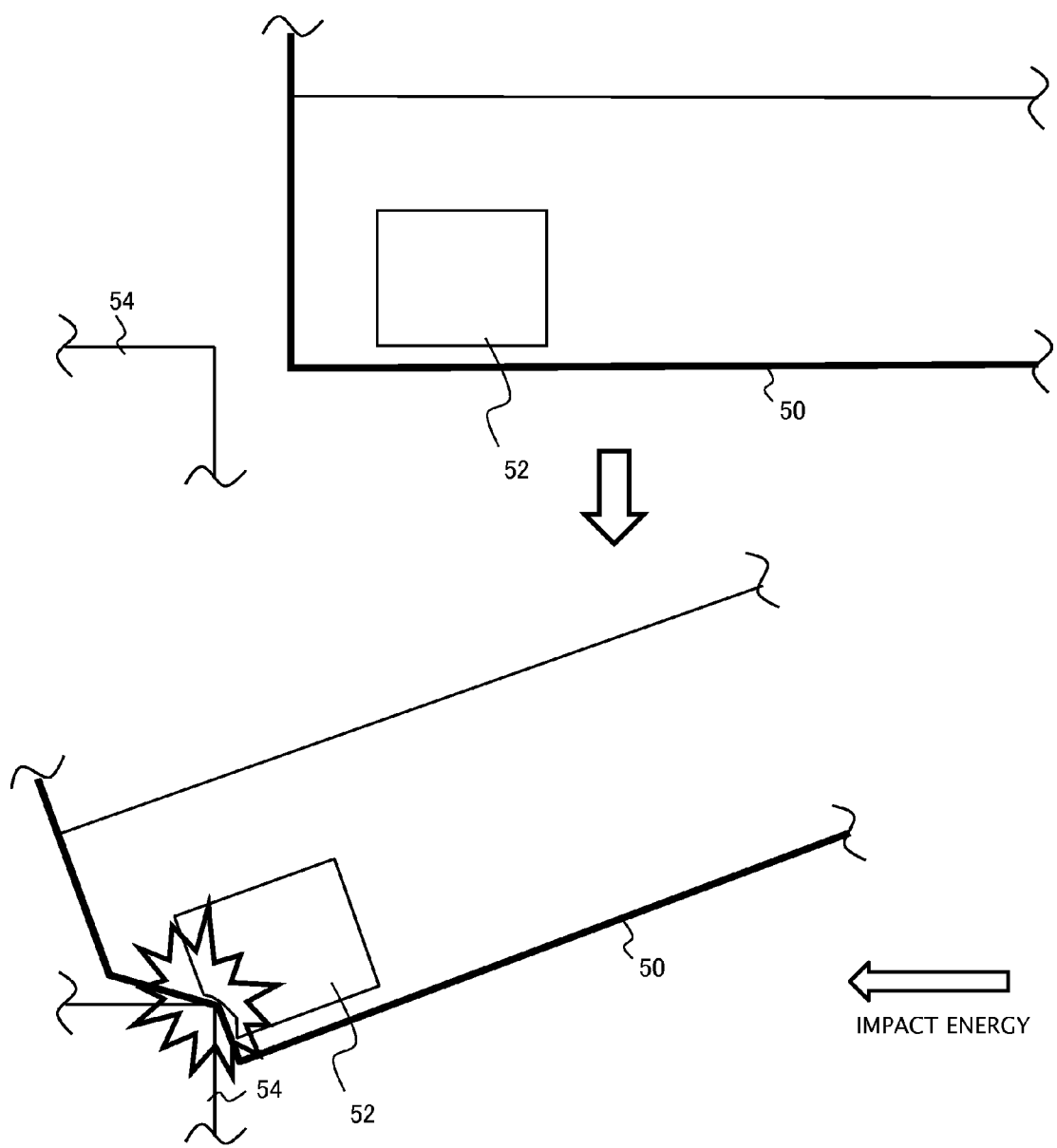
FIG. 7
View schematically illustrating a state in which a conventional member that contains an electronic component interferes with an external interfering object.

The member that contains electronic components and the power conversion device according to the present embodiment can be mounted in a vehicle or the like such as a hybrid vehicle, an electronic vehicle, a fuel cell vehicle, and so on. While the member that contains electronic components and the power conversion device according to the present embodiment can be disposed on the front portion, the rear portion, or the like of a vehicle or the like, for example, the location of disposition is not particularly limited. FIG. 6 illustrates an example in which the container member can be mounted in a vehicle when the electronic component contained in the container member for electronic components according to the present embodiment is an inverter. In the example illustrated in FIG. 6, the container member 1 containing an inverter can be mounted on the left side in the front portion of the vehicle 24, for example. With the container member for electronic components according to the present embodiment, it is possible to prevent the housing from interfering with an interfering object which is a peripheral component such as trans-axle and being damaged, when the left side in the front portion of the vehicle 24 collides with an external object.

REFERENCE SYMBOL LIST 1 container member for electronic component, 10, 50 housing, 12 cooling passage, 14 plate member, 16, 52 high-voltage portion, 18 gap portion, 20, 54 interfering object, 22 rib member, 24 vehicle

The invention claimed is:

1. A member that contains an electronic component, the member comprising:
    a housing that contains an electronic component;
        a cooling passage that is provided within the housing for cooling heat generated from the electronic component by a refrigerant; and
        a heat dissipation section that dissipates heat from the cooling passage and prevents damage to the housing caused by impact from an external interfering object.

2. The member that contains an electronic component according to claim 1, wherein
    at least a portion of the cooling passage is provided so as to be opposed to the external interfering object with the heat dissipation section being interposed between the cooling passage and the external interfering object.

3. The member that contains an electronic component according to claim 2, wherein
    a high-voltage portion of the electronic component is provided so as to be opposed to the external interfering object with the heat dissipation section and at least a portion of the cooling passage being interposed therebetween.

4. The member that contains an electronic component according to claim 1, wherein
    the heat dissipation section is formed of a plate member provided on an external surface of the housing.

5. The member that contains an electronic component according to claim 4, wherein
    with the plate member, a gap portion is formed between the external surface of the housing and the plate member.

6. The member that contains an electronic component according to claim 4, wherein
    the plate member has a slope shape.

7. The member that contains an electronic component according to claim 1, wherein
    the heat dissipation section is formed of an inclined rib member provided on an external surface of the housing.

8. The member that contains an electronic component according to claim 1, wherein
    the electronic component is a power converter that performs power conversion from direct-current power or alternating-current power from a power source to alternating-current power or direct-current power.

9. A power conversion device, comprising
    the member that contains an electronic component according to claim 1; and
    a power converter that is contained in the member that contains an electronic component for performing power conversion from direct-current power or alternating-current power from a power source to alternating-current power or direct-current power.

* * * * *